United States Patent [19]

Horowitz et al.

[11] Patent Number: 5,254,883
[45] Date of Patent: Oct. 19, 1993

[54] ELECTRICAL CURRENT SOURCE CIRCUITRY FOR A BUS

[75] Inventors: Mark A. Horowitz, Palo Alto; James A. Gasbarro, Mountain View; Wingyu Leung, Cupertino, all of Calif.

[73] Assignee: Rambus, Inc., Mountain View, Calif.

[21] Appl. No.: 872,919

[22] Filed: Apr. 22, 1992

[51] Int. Cl.⁵ .................................... H03K 19/003
[52] U.S. Cl. ........................ 307/443; 307/475; 307/296.8
[58] Field of Search ............ 307/443, 448, 475, 359, 307/270, 296.6, 296.8; 365/49, 189.05

[56] References Cited

U.S. PATENT DOCUMENTS

| | | | |
|---|---|---|---|
| 4,247,817 | 1/1981 | Heller | 307/354 X |
| 4,481,625 | 11/1984 | Roberts et al. | 370/85 |
| 4,519,034 | 5/1985 | Smith et al. | 364/200 |
| 4,625,320 | 11/1986 | Butcher | 307/359 X |
| 4,785,394 | 11/1988 | Fischer | 364/200 |
| 4,811,202 | 3/1989 | Schabowski | 364/200 |
| 4,860,198 | 8/1989 | Takenaka | 364/200 |
| 5,023,488 | 6/1991 | Gunning | 307/475 |
| 5,105,102 | 4/1992 | Shioda | 307/475 X |
| 5,117,130 | 5/1992 | Shoji | 307/448 X |
| 5,118,971 | 6/1992 | Schenck | 307/443 |
| 5,134,311 | 7/1992 | Biber et al. | 307/443 X |
| 5,162,672 | 11/1992 | McMahan et al. | 307/443 |
| 5,194,765 | 3/1993 | Dunlop et al. | 307/475 X |

FOREIGN PATENT DOCUMENTS 9116680 10/1991 PCT Int'l Appl. .

OTHER PUBLICATIONS

T. Yang, M. Horowitz, and B. Wooley, "A 4-ns 4Kx1-bit Two-Port BiCMOS SRAM," IEEE Journal of Solid-State Circuits, vol. 23, No. 5, pp. 1030-1040 (Oct. 1988).

H. Schumacher, J. Dikken, and E. Seevinck, "CMOS Subnanosecond True-ECL Output Buffer," IEEE Journal of Solid-State Circuits, vol. 25, No. 1, pp. 148-154 (Feb. 1990).

T. Chappell, B. Chappell, S. Schuster, J. Allan, S. Klepner, R. Joshi, R. Franch, "A 2ns Cycle, 4ns Access 512kb CMOS ECL SRAM," IEEE International Solid-State Circuits Conference, pp. 50-51 (1991).

Primary Examiner—David R. Hudspeth
Attorney, Agent, or Firm—Blakely, Sokoloff, Taylor & Zafman

[57] ABSTRACT

Electrical current source circuitry for a bus is described. The circuitry includes transistor circuitry coupled between the bus and ground for controlling bus current, control circuitry coupled to the transistor circuitry, and a controller coupled to the control circuitry for controlling the transistor circuitry. The controller comprises a variable level circuit comprising setting circuitry for setting a desired current for the bus and transistor reference circuitry coupled to the setting circuitry. The variable level circuit provides a first voltage. Voltage reference circuitry provides a reference voltage. Comparison circuitry is coupled to the voltage reference circuitry and to the variable level circuit for comparing the first voltage with the reference voltage. Logic circuitry is responsive to a trigger signal from the comparison circuitry. An output of the logic circuitry is coupled to the control circuitry in order to turn on the transistor circuitry in a manner dependent upon an output of the logic circuitry.

39 Claims, 10 Drawing Sheets

FIG_2

FIG_3

FIG.—4

FIG_5

FIG_6

FIG_7

FIG _ 8

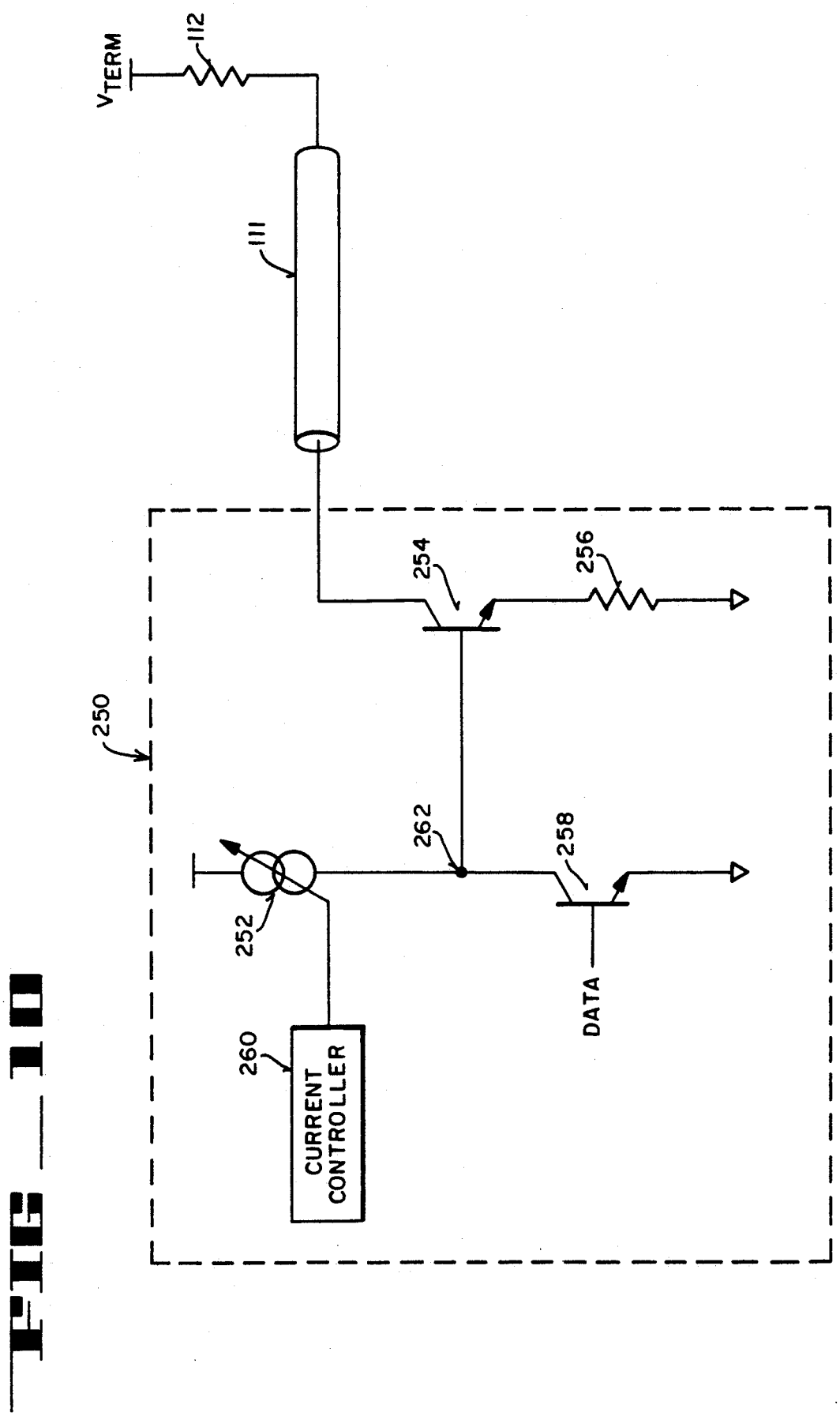

ELECTRICAL CURRENT SOURCE CIRCUITRY FOR A BUS

FIELD OF THE INVENTION

The present invention pertains to the field of electrical buses. More particularly, the present invention relates to current source driver circuitry for a high speed bus system.

BACKGROUND OF THE INVENTION

Computer systems and other electronic systems typically use buses for interconnecting integrated circuit components so that the integrated circuit components can communicate with one another. Prior buses typically connect masters such as microprocessors and controllers and slaves such as memories and bus transceivers.

Certain prior buses employ relatively large voltage swings. For example, one prior bus has rail to rail voltage swings between a high level voltage of 3.5 to 5 volts and a low level voltage of approximately zero volts.

One disadvantage of large voltage swing buses is the relatively high level of power dissipation. Another disadvantage of large voltage swing buses is the relatively high level of induced noise. The problems of high power dissipation and a high level of induced noise become ever more severe when buses are run at higher and higher frequencies.

Another typical disadvantage of large voltage swing buses is a speed limitation caused by the high slew rate of the bus driver.

Buses with relatively low rail-to-rail voltage swings have been developed to minimize power dissipation and noise, especially at high bus frequencies. Certain buses with low voltage swings also typically permit higher frequencies.

Each master and slave coupled to a prior bus typically includes output driver circuitry for driving signals onto the bus. Some prior bus systems have output drivers that use transistor-transistor logic ("TTL") circuitry. Other prior bus systems have output drivers that include emitter-coupled logical ("ECL") circuitry. Other output drivers use CMOS or N-channel metal oxide semiconductor ("NMOS") circuitry. Gunning transistor logic ("GTL") has also been used in other prior output drivers.

Many prior buses are driven by voltage level signals. It has become advantageous, however, to provide buses that are driven by a current mode output driver. One benefit to a current mode driver is a reduction of peak switching current. For a voltage mode driver the output transistor of the driver must be sized to drive the maximum specified current under worst case operating conditions. Under nominal conditions with less than maximum load, the current transient when the output is switched, but before it reaches the rail, can be very large. The current mode driver, on the other hand, draws a known current regardless of load and operating conditions. In addition, for a voltage mode driver impedance discontinuities occur when the driving device is characterized by a low output impedance when in a sending state. These discontinuities cause reflections which dictate extra bus settling time. Current mode drivers, however, are characterized by a high output impedance so that a signal propagating on the bus encounters no significant discontinuity in line impedance due to a driver in a sending state. Thus, reflections are typically avoided and the required bus settling time is decreased.

An example of a current mode bus is disclosed in U.S. Pat. No. 4,481,625, issued Nov. 6, 1984, entitled *High Speed Data Bus System*. An NMOS current mode driver for a low voltage swing bus is disclosed in PCT international patent application number PCT/US91/02590 filed Apr. 16, 1991, published Oct. 31, 1991, and entitled *Integrated Circuit I/O Using a High Perforamnce Bus Interface.*

One disadvantage of certain prior current mode drivers is that current sometimes varies from driver to driver. Variations can also happen over time. Temperature variations, process variations, and power supply variations sometimes cause such variations. Current variations in turn lead to voltage level variations on the bus. Bus voltage level variations can in turn lead to the erroneous reading of bus levels, which can reuslt in the loss of data or other errors. In addition, attempts to design around these variations by raising voltage levels sometimes leads to higher power dissipations, especially in extreme cases. In any event, variations in bus voltage levels are typically more problematic for buses with low voltage swings.

Certain prior feedback techniques have been used to control current. An article by H. Schumacher, J. Dikken, and E. Seevinck entitled *CMOS Subnanosecond True-ECL output Buffer, J. Solid State Circuits,* Vol. 25, No. 1, pages 150–54 (February 1990) includes a disclosure of the use of feedback.

SUMMARY AND OBJECTS OF THE INVENTION

One object of the present invention is to provide an improved current mode driver for a bus.

Another object of the present invention is to provide a current mode driver that provides a relatively accurate current.

Another object of the present invention is to provide a current mode driver that minimizes current variations when there are variations in supply voltage, temperature, and processing.

Another object of the present invention is to provide a current mode driver with a performance that is relatively independent of voltage supply variations, temperature variations, and processing variations.

Another object of the present invention is to provide a current mode driver having a user-settable current.

Another object of the present invention is to provide a current mode driver that minimizes space.

Electrical current source circuitry for a bus is described. The circuitry includes transistor circuitry coupled between the bus and ground for controlling bus current, control circuitry coupled to the transistor circuitry, and a controller coupled to the control circuitry for controlling the transistor circuitry. The controller comprises a variable level circuit comprising setting means for setting a desired current for the bus and transistor reference means coupled to the setting means. The variable level circuit provides a first voltage. A voltage reference means provides a reference voltage. A comparison means is coupled to the voltage reference means and to the variable level circuit for comparing the first voltage with the reference voltage. Logic circuitry is responsive to a trigger signal from the comparison means. An output of the logic circuitry is coupled to the control circuitry in order to turn on the transistor circuitry in a manner dependent upon an output of the logic circuitry.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 10 is a circuit diagram of yet another current mode driver.

DETAILED DESCRIPTION

Figure 1:
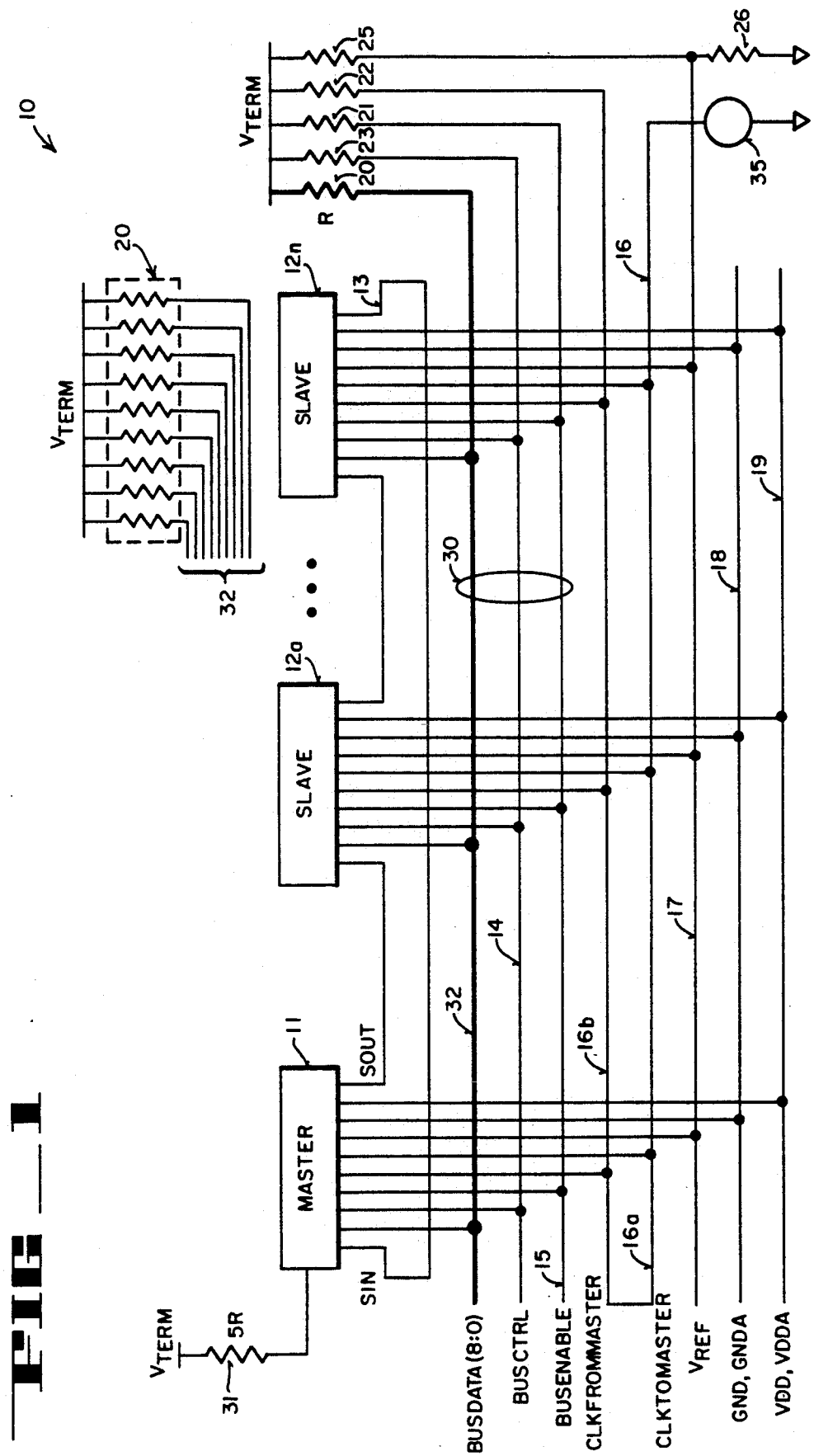
FIG. 1 is a block diagram of a bus system, including a master, a plurality of slaves, and a bus.

FIG. 1 is a block diagram of a bus system 10. Bus system 10 includes a bus 30 that is coupled to master 11 and a plurality of slaves 12a–12n for transferring data between the masters and the slaves. Bus 30 is a high speed, low voltage swing bus that comprises a total of eleven lines.

Master 11 and each of the slaves 12a–12n includes an interface circuit for coupling its respective master or slave to bus 30. The interface circuit includes a plurality of current mode drivers for driving bus 30. For each master and slave, there is one output driver for each transmission line of bus 30. Each of the current mode drivers accurately provides a desired current for the respective line of bus 30.

As described in more detail below, each of the current mode drivers includes a plurality of transistors coupled in parallel between a respective line of the bus and ground. A logic circuit is coupled to the gates of the plurality of transistors. The widths of the transistors are binary multiples of one another. A current controller is coupled to the logic circuit for controlling the logic circuit in order to turn on or off a particular combination of the plurality of transistors such that the desired current can be selected for the line of the bus. The desired current for the line of the bus in turn becomes a desired voltage for the line of bus 30. The controller includes a variable level circuit, a comparator, a counter, and a control logic. Once selected, the desired current is relatively independent of power supply, process, and temperature variations.

Within bus system 10, a master can communicate with another master (not shown) and with slaves. In contrast, slaves only communicate with masters.

Master 11 of FIG. 1 contains intelligence and generates requests. In one embodiment, master 11 is a microprocessor. In another embodiment, master 11 is a digital signal processor. In yet another embodiment, master 11 is a graphics processor. In alternative embodiments, other types of processors or controllers can be employed as master 11. For example, master 11 may be peripheral controller, an input/output ("I/O) controller, a DMA controller, a graphics controller, a DRAM controller, a communications device, or another type of intelligent controller.

Slaves only require a low level of intelligence. In one embodiment, slaves 12a–12n comprise DRAMs. In other embodiments, slaves 12a–12n may include other types of memories, such as elecrical programmable read only memories ("EPROMs"), flash EPROMs, RAMs, static RAMs ("SRAMs"), and video RAMs ("VRAMs"). For another embodiment, slaves 12a–12n are bus transceivers.

Master 11 and slaves 12a–12n each includes BusData [8:0]pins, a BusCtrl pin, a BusEnable pin, a ClkToMaster pin, a ClkFromMaster pin, and a $V_{ref}$ pin. These pins receive and transmit low voltage swing signals. The BusData pins are used for data transfer. In one embodiment, the BusData pins comprise nine data pins. The BusCtrl and BusEnable pins are used for transferring bus control signals for controlling communication on bus 30. The ClkToMaster and ClkFromMaster pins receive clock signals. The ClkToMaster pin receives a "clock-to-master" signal. The ClkFromMaster pin receives a "clock-from-master" signal The $V_{ref}$ pin receives a reference voltage $V_{ref}$.

Master 11 and each of the slaves 12a–12n also includes an SIn pin and an SOut pin. The SIn pin and SOut pins are coupled to form a daisy chain for device initialization. Master 11 and each of the slaves 12a–12n also includes Gnd and GndA ground pins (coupled to lines 18) and Vdd and VddA power supply pins (coupled to lines 19). For one embodiment, power supply voltages Vdd and VddA are each five volts.

Bus 30 includes BusData data transmission lines 32, a BusCtrl line 14, and a BusEnable line 15. Bus 30 carries low voltage swing signals that are described in more detail below.

Data transmission lines 32 comprise a data bus for transferring data between master 11 and slaves 12a–12n. For one embodiment, data transmission lines 32 are capable of transferring data at rates up to 500 Megabytes per second.

Data transmission lines 32 comprise nine transmission lines. These transmission lines are matched transmission lines and have controlled impedances. Each line of data transmission lines 32 is terminated at one end by a termination resistor. As shown in FIG. 1, there are nine termination resistors, each connected to a respective one of data transmission lines 32. These termination resistors are collectively referred to as termination resistors 20. Termination resistors 20 are coupled to termination voltage $V_{term}$.

The resistance value of each of termination resistors 20 is R, which is equal to the line impedance of each transmission line of data transmission lines 32. In one embodiment, the termination voltage $V_{term}$ is approximately 2.5 volts. Each of the termination resistors 20 is matched to the respective transmission line impedance. This helps to prevent reflections.

BusCtrl line 14 transfers the bus control signal among master 11 and slaves 12a–12n. BusEnable line 15 transfers the bus enable signal among master 11 and slaves 12a–12n. BusCtrl line 14 is terminated at one end by termination resistor 23. BusEnable line 15 is terminated at one end by termination resistor 21. Termination resistors 21 and 23 are each coupled to the termination voltage $V_{term}$. Each of the termination resistors 21 and 23 is matched to the respective line impedance. This helps to prevent reflections.

Bus system 10 also includes daisy chain line 13 and clock line 16. Daisy chain line 13 couples the SOut pin of one device to the SIn pin of another device (i.e., chained) for transferring TTL signals for device initialization. Line 16 is terminated by termination resistor 22.

Clock line 16 is coupled to a clock 35 at one end. In one embodiment, clock 35 is external to and independent of master 11 and slaves 12a–12n. The clock signal generated by clock 35 travels only in one direction. Clock line 16 carries the clock signal to master 11 and slaves 12a–12n. Clock line 16 is folded back to include two segments 16a and 16b. Segment 16a carries a "clock-to-master" signal and segment 16b carries a "clock-from-master" signal.

Figure 2:
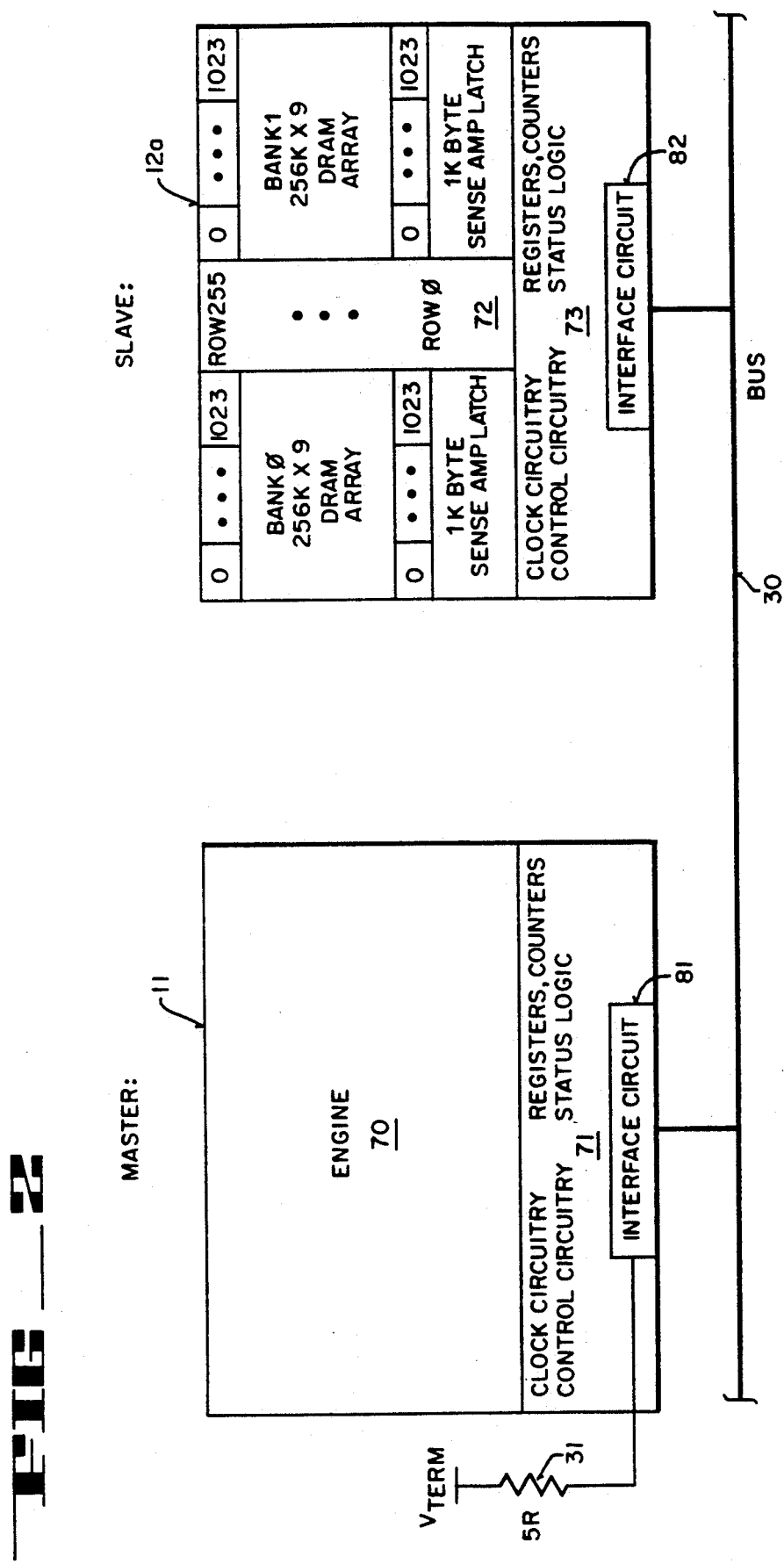
FIG. 2 is a block diagram of a master and a slave coupled to the bus, wherein the master and slave each includes an interface circuit.

Bus system 10 also includes a reference voltage line 17 that couples the reference voltage $V_{ref}$ to each of master 11 and slaves 12a–12n. As shown in FIG. 2, the $V_{ref}$ voltage is generated by a voltage divider formed by resistors 25 and 26, with the termination voltage $V_{term}$ being coupled to resistor 25. In one embodiment, the reference voltage $V_{ref}$ is approximately 2.20 volts. In another embodiment, the reference voltage $V_{ref}$ is approximately 2.25 volts.

Data driven by master 11 propagates past slaves 12a–12n along bus 30 and slaves 12a–12n can correctly sense the data provided by master 11. Slaves 12a–12n can also send data to master 11.

In an alternative embodiment, bus system 10 may include two masters coupled to the end of bus 30 that is opposite termination resistors 20, 21, and 23.

Master 11 initiates an exchange of data by broadcasting an access request packet. Each of slaves 12a–12n decodes the access request packet and determines whether that slave is the selected slave and the type of access requested. The selected slave then responds appropriately.

As described in more detail below, master 11 is coupled to the termination voltage $V_{term}$ via a resistor 31. Resistor 31 is used to set a desired current for bus 30. Resistor 31 is located external to master 11. The resistance of resistor 31 is 5R—i.e., five times that of each of termination resistors 20. For other embodiments, other resistance values may be used for resistor 31 and resistors 20.

FIG. 2 is a block diagram of master 11 and slave 12a. In FIG. 2, slave 12a is a DRAM.

Master 11 includes an engine 70 and peripheral circuitry 71. For one embodiment of the present invention, engine 70 is a microprocessor. Peripheral circuitry 71 includes clock circuitry, control circuitry, registers, counters, and status logic. Master 11 is coupled to bus 30 via an interface circuit 81.

Similarly, slave 12a includes DRAM circuitry 72 and peripheral circuitry 73. DRAM circuitry 72 includes a memory array and sense circuitry. Like peripheral circuitry 71, peripheral circuitry 73 also includes clock circuitry, control circuitry, registers, counters, and status logic. Slave 12a is coupled to bus 30 via interface circuit 82.

Interface circuits 81 and 82 each converts between low-swing voltage levels used by bus 30 and ordinary CMOS logic levels used by much of the circuitry of master 11 and slave 12a.

Interface circuits 81 and 82 each includes a plurality of current mode drivers for driving the data onto bus 30. The current mode drivers are also referred to as electrical current sources. Bus 30 is a current mode bus that is driven by the current source output drivers. Each of the current mode drivers in interface circuit 81 is coupled to a respective transmission line of bus 30. That is also true with respect to each of the current mode drivers in interface circuit 82.

Slaves 12b–12n have similar circuitry to that of slave 12a. It is to be appreciated that master 11 and slaves 12a–12n each include current mode output drivers for bus 30.

Even though the drivers for bus 30 are current mode drivers, bus 30 carries low voltage swing signals. The current mode drivers of master 11 and slaves 12a–12n control the voltage levels of bus 30. When a current mode driver is in an "off" state, the respective bus line either stays at or rises to a high voltage level. When the current mode driver is in an "off" state, there is approximately zero voltage drop across the respective termination resistor of resistors 20 because the current mode driver is not providing a path to ground for current. The high voltage level for bus 30 is the termination voltage $V_{term}$.

When a current mode driver is in an "on" state, the current mode driver provides a path to ground for current for the respective bus line. In other words, when the current mode driver is in an "on" state, pull down current flows through the current driver. The low voltage level of bus 30, is accordingly, determined by the pull down current. The pull down current flows through the respective resistor of termination resistor of resistors 20. A voltage drop appears across the respective termination resistors 20, and a low voltage level appears on the respective line of bus 30. The pull down current (flowing through the output driver and the respective termination resistor) is referred to as the desired current. The magnitude of the desired current can be set or selected by the user to allow for different bus impedance, noise immunity, and power dissipation requirements. Circuitry described below permits the desired current to be substantially independent of processing variations, power supply variations, and temperature variations.

Figure 3:
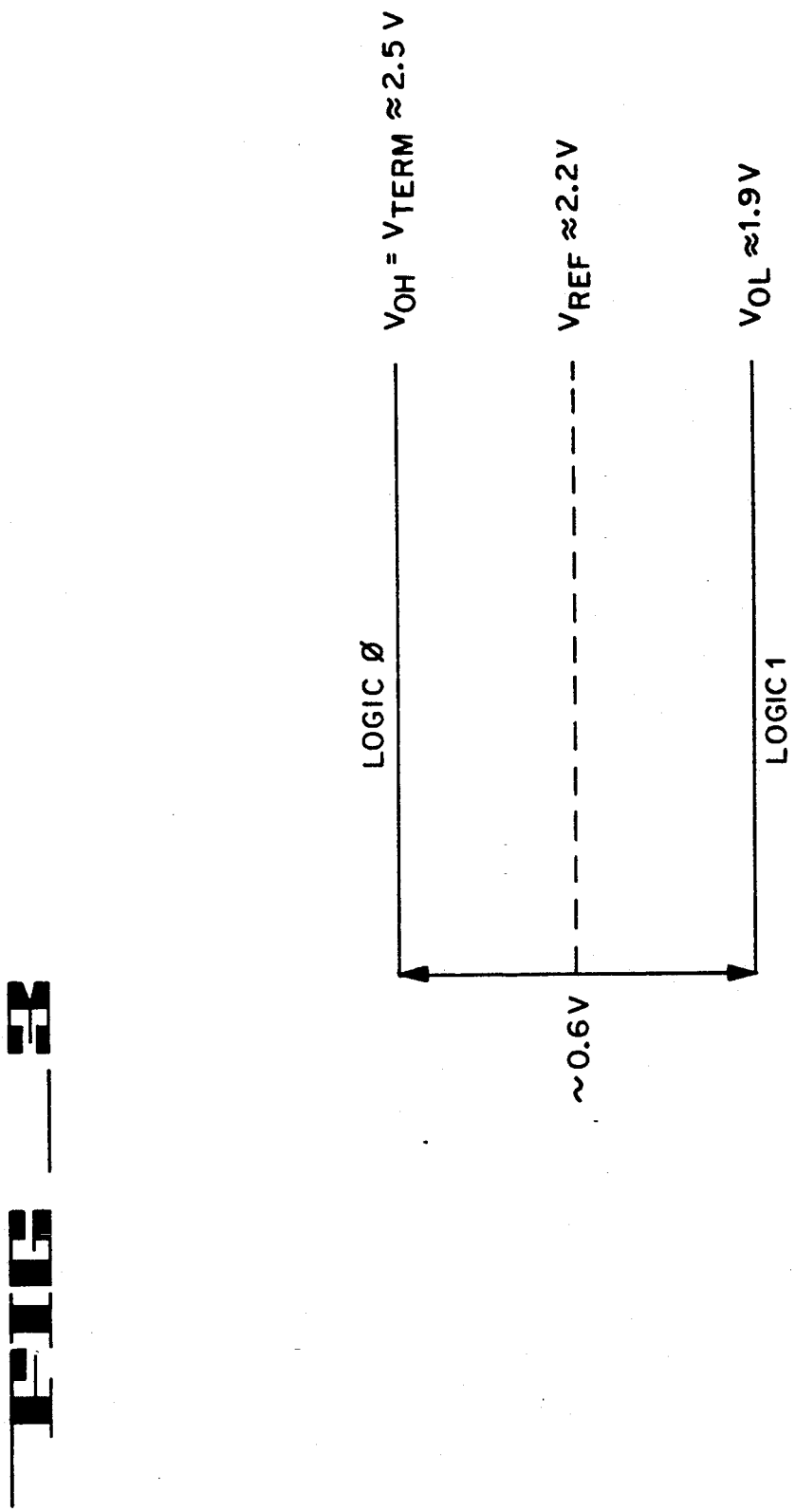
FIG. 3 is a voltage level diagram illustrating the voltage levels of the logic one and logic zero signals of the bus system of FIG. 1.

FIG. 3 illustrates preferred voltage levels $V_{OH}$ (i.e., $V_{term}$) and $V_{OL}$ for bus system 10. $V_{OH}$—the high voltage level—is approximately 2.5 volts. $V_{OL}$—the low voltage level—is approximately 1.9 volts. The reference voltage is 2.2 volts. The voltage swing is approximately 0.6 volts. For one embodiment, the $V_{OH}$ voltage represents a logical zero state and the $V_{OL}$ voltage represents a logical one state.

For an alternative embodiment, the $V_{OH}$ voltage is approximately 2.5 volts, the $V_{OL}$ voltage is approximately 2.0 volts, the voltage swing is approximately 0.5 volts, and the reference voltage is 2.25 volts.

As discussed in more detail below, the termination voltage $V_{term}$ can be changed and the low voltage $V_{OL}$ can be selected or set by the user by selecting a desired current.

Given that $V_{OH}$ is a logical zero state, this means that a current mode driver is placed into the "off" (i.e., nonconducting) state when the respective master or slave wants to drive a logical zero signal onto the respective line of bus 30. Given that $V_{OL}$ is a logical one state, this means that a current mode driver is placed into the "on" (i.e., conducting) state when the respective master or slave wants to drive a logical one signal onto the respective line of bus 30.

Figure 4:
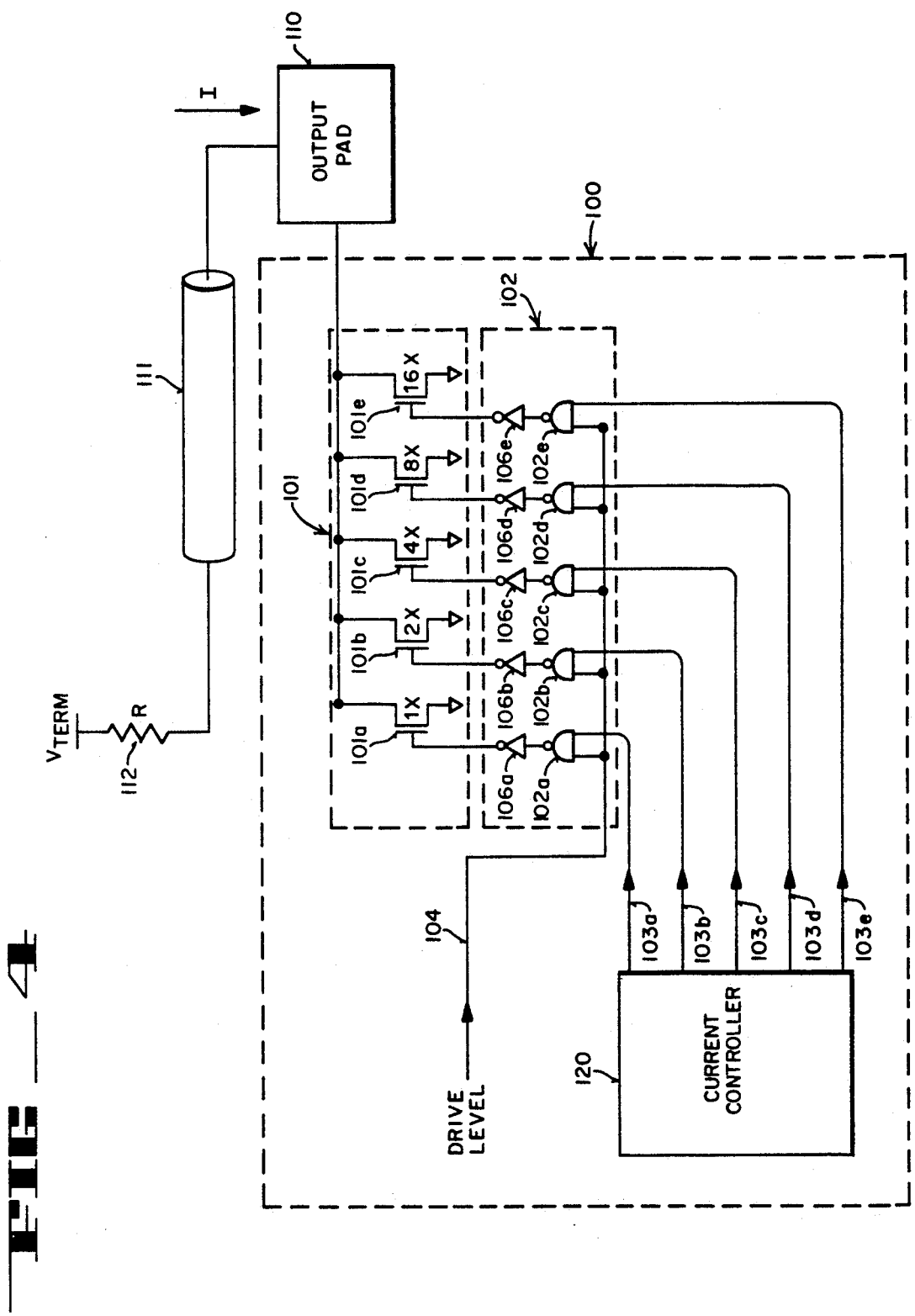
FIG. 4 is a circuit diagram of a current mode driver, including a current controller and an NMOS transistor array.

FIG. 4 is a block diagram of a current mode driver 100. Driver 100 represents one of the plurality of current mode drivers found in master 11 and slaves 12a-12n.

In FIG. 4, driver 100 is coupled to data transmission line 111 via output pad 110. Data transmission line 111 is one of the data transmission lines 32 of bus 30. Transmission line 111 is coupled to the termination voltage $V_{term}$ via termination resistor 112 that resides at one end. Termination resistor 112 is one of resistors 20.

Driver 100 includes an output transistor array 101. Transistor array 101 is comprised of five transistors 101a through 101e. For alternative embodiments, transistor array 101 can include more or fewer than five transistors. For example, transistor array 101 may include eight transistors.

For one embodiment, transistors 101a-101e of transistor array 101 are N-channel MOS transistors.

Transistors 101a-101e of transistor array 101 are coupled in parallel between ground and output pad 110. Each of transistor 101a-101e has a different width. The widths of transistors 101a-101e are governed by a binary relationship. This is shown by the designations 1X, 2X, 4X, 8X, and 16X in FIG. 4. The symbol "x" means "times." For example, the width of transistor 101b is twice that of transistor 101a. The width of transistor 101c is twice that of transistor 101b.

Transistors 101a-101e are used to provide a path to ground for current. When one or more of transistors 101a-101e is turned on, current flows through each transistor that is turned on. The current flow results in a voltage drop across resistor 112. This results in the lowering of the voltage on line 111 of bus 30. When transistors 101a-101e are all turned off, then no current flows through transistors 101. This means that no current flows through resistor 112, so there is no voltage drop across resistor 112. Thus, when transistors 101a-101e are all turned off, the termination voltage $V_{term}$ appears on line 111 of bus 30. Thus, transistors 101 are used to control current and voltage with respect to line 111 of bus 30. Turning on various combinations of transistors 101a-101e results in various currents and voltages with respect to line 111 of bus 30.

For one embodiment, the maximum current that transistor array 101 can regulate is $I_{MAX}$. Transistor 101a contributes 1/31 of the $I_{MAX}$ current, transistor 101b contributes 2/31 of the $I_{MAX}$ current, etc. Because the current contributed by each of transistors 101a-101e sums at output pad 110, the desired current that driver 100 can provide can be varied in 32 discrete steps from zero to $I_{MAX}$ in order to provide different desired currents relatively accurately. This is done by turning on various combinations of transistors 101a-101e.

For alternative embodiments, transistors 101a-101e have width ratios other than binary multiples. For example, transistors 101a-101e may be governed by a log width ratio (i.e., 1X, 2X, 5X, 10X, and 20X). As a further example, the widths of transistor 101a-101e may be governed by an integer series (i.e., 1X, 2X, 3X, 4X, and 5X).

For one embodiment, driver 100 should provide approximately a 35 milliampere constant current under worst case operating conditions. In a one micron ("1 μ") MOS technology, the total width of all the transistors 101a-101e comprising transistor array 101 should be approximately 400 micrometers ("μm"). Therefore, for one embodiment the width of the smallest transistor 101a of transistor array 101 should be approximately 12.9 μm (i.e., 400 μm/31).

Figure 5:
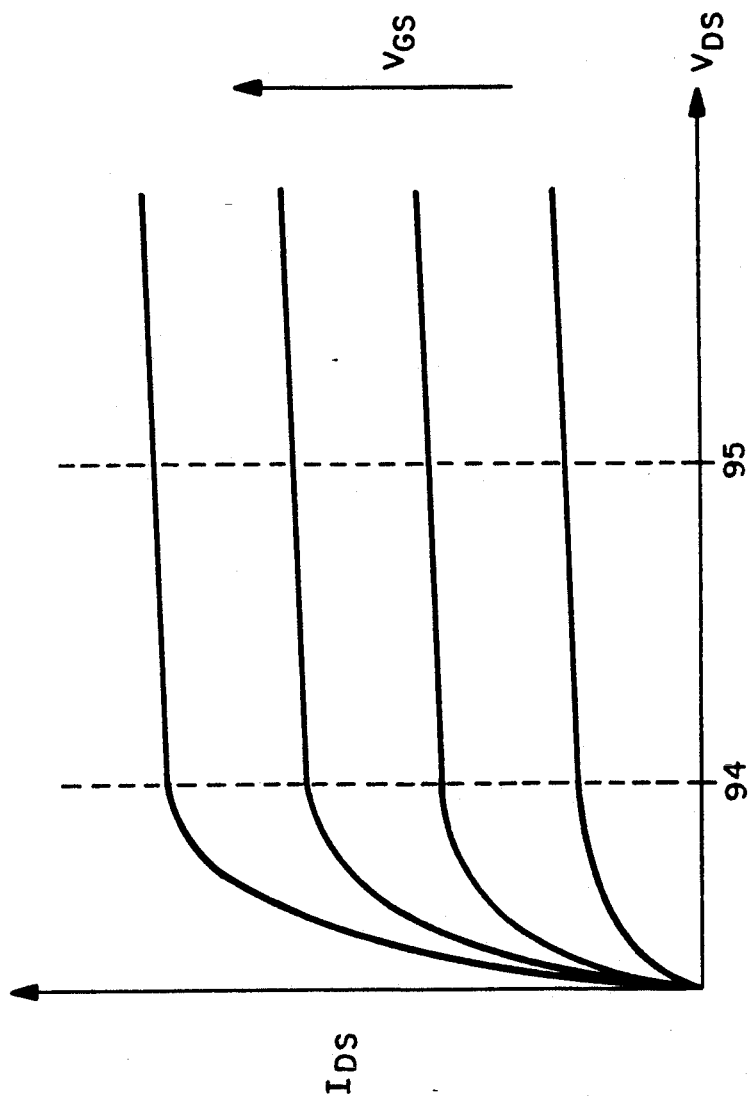
FIG. 5 is a current-voltage diagram of an NMOS transistor, illustrating the drain current with respect to the drain-to-source voltage and the gate-to-source voltage.

FIG. 5 illustrates the relationship of the drain current with respect to the drain-source voltage $V_{DS}$ and the gate-source voltage $V_{GS}$ for an NMOS transistor. An NMOS transistor, when operated under the right conditions, acts as a relatively good current source. As long as the drain-source voltage is kept above a minimum level (for example, shown by line 94), the drain current is constant and essentially independent of the $V_{DS}$ voltages. Thus, as long as the bus voltage levels are chosen to be high enough, a simple NMOS transistor will work well as a current source. Nevertheless, the larger the voltage level, the higher the power dissipation when the transistor is in the on state. Therefore, a balance must be established between current mode behavior and power dissipation. For example, a range defined by lines 94 and 95 as shown in FIG. 5 maintains the $V_{DS}$ above a minimum level (to allow current to be independent of $V_{DS}$) while minimizing $V_{DS}$ (to minimize power dissipated during voltage swings).

Referring back to FIG. 4, driver 100 also includes output logic circuitry 102. Logic circuitry 102 includes five NAND gates 102a-102e and five inverters 106a-106e. The output of each of NAND gates 102a-102e is coupled to the input of a respective one of inverters 106a-106e. The output of each of inverters 106a-106e is coupled to a gate of a respective one of transistors 101a-101e. For example, the output of NAND gate 102a is coupled to inverter 106a and the output of NAND gate 102b is coupled to inverter 106b.

Each of NAND gates 102a-102e includes two inputs. One input of each of NAND gates 102a-102e receives an output signal (i.e., drive level) via line 104. The other input of each of NAND gates 102a-102e is coupled to a current controller 120 via one respective line of lines 103a through 103e.

For one embodiment, the drive level signal on line 104 comes from other circuitry of the respective master or slave in which output driver 100 resides. For example, if output driver 100 resides in slave 12a, and if slave 12a includes a DRAM, then drive level signal line 104 is coupled to an output signal from the memory array of the DRAM. As another example, if output driver 100 resides in master 11, then drive signal level line 104 is coupled to an output signal from the engine (for example, a microprocessor) of master 11.

Each NAND gate (of gates 102a-102e) and its respective inverter (of inverters 106a-106e) performs an AND logic function with respect to the inputs to the NAND gate.

For one alternative embodiment, logic circuitry 102 instead has five AND gates, each being coupled to a gate of a respective transistor of transistors 101a-101e.

For one preferred embodiment, there is one current controller 120 per master and per slave. For example, master 11 contains one current controller, slave 12a contains another current controller, slave 12b contains yet another current controller, etc.

For that embodiment, however, there are eleven sets of output transistors and output logic circuitry per master and per slave. For example, master 11 contains eleven sets of output transistors 101 and output logic circuitry 102—one set for each transmission line of bus 30. Slave 12a contains eleven other sets of output transistors and output logic circuitry—one set for each transmission line of bus 30. Within each master or slave, the outputs 103a–103e of the particular current controller of that master or slave are coupled to each of the eleven sets of output logic circuitry for that particular master or slave. For example, if current controller 120 resides in master 11, then the outputs 103a–103e of current controller 120 are coupled not only to output logic circuitry 102, but also to ten other sets of output logic circuitry similar to output logic circuitry 102. Master 11 would then have a total of eleven sets of output transistors and eleven sets of output logic circuitry. There is one set of output transistors (and output logic circuitry) per transmission line of bus 30. The combination of the single current controller 120 and one set of output transistors 101 and output logic circuitry 102 can be considered to be one output driver 100. The single current controller 120 and the eleven sets of output transistors and output logic circuitry comprise eleven output drivers. The eleven output drivers have in common (and share) the single current controller 120.

For an alternative embodiment, there are eleven current controllers per master and per slave. For example, master 11 would contain eleven current controllers. For that alternative embodiment, each current controller would be independently coupled to its own particular output logic circuitry associated with a particular transmission line. For that alternative embodiment, the eleven sets of output transistors (and output logic circuitry) thus would not share a single current controller. Instead, each set of output transistors and output logic circuitry would have its own associated current controller.

Each of NAND gates 102a–102e and a respective inverter of inverters 106a–106e shown in the embodiment of FIG. 4 permits a respective transistor of transistor array 101 to be turned on and off. Thus, logic circuitry 102 provides a control function with respect to the voltage level on line 111 of bus 30. For example, when the output signal coupled to line 104 is a logical low signal, NAND gates 102a–102e and inverters 106a–106e switch each of the transistors 101a–101e off, which in turn cuts off the current flow through transmission line 111. On the other hand, when the output signal coupled to line 104 is a logical high signal, the on and off states of transistors 101a–101e depend upon the signals on respective lines 103a–103e.

Current controller 120 uses a reference current to decide what combination of transistors 101a–101e will result in the desired current on transmission line 111 under the existing operating conditions. Controller 120 outputs a five bit binary logic value to logic circuitry 102 on lines 103a–103e. The five bit value is ANDed with the output signal on line 104 to control the turning on of one or more of transistors 101a–101e. For example, when current controller 120 applies a "00100" binary logic value to logic circuitry 102 via lines 103a–103e, NAND gate 102c outputs a logical low signal to inverter 106c when drive level 104 is logically high, which in turn applies a logic high signal to the gate of transistor 101c. This turns transistor 101c on, and transistor 101c thus provides a path to ground for current from line 111. This leads to a voltage drop across resistor 112. The results in a lower voltage on line 111 of bus 30. Other transistors 101a–101b and 101d–101e are, however, turned off by the logical zero values sent to logic circuitry 102 via lines 103a–103e.

In one embodiment, current controller 120 of FIG. 4 is a resistor reference current controller. In another embodiment, current controller 120 is a capacitor reference current controller.

The current provided by driver 100 is substantially independent of power supply variations, process variations, and temperature variations.

Figure 6:
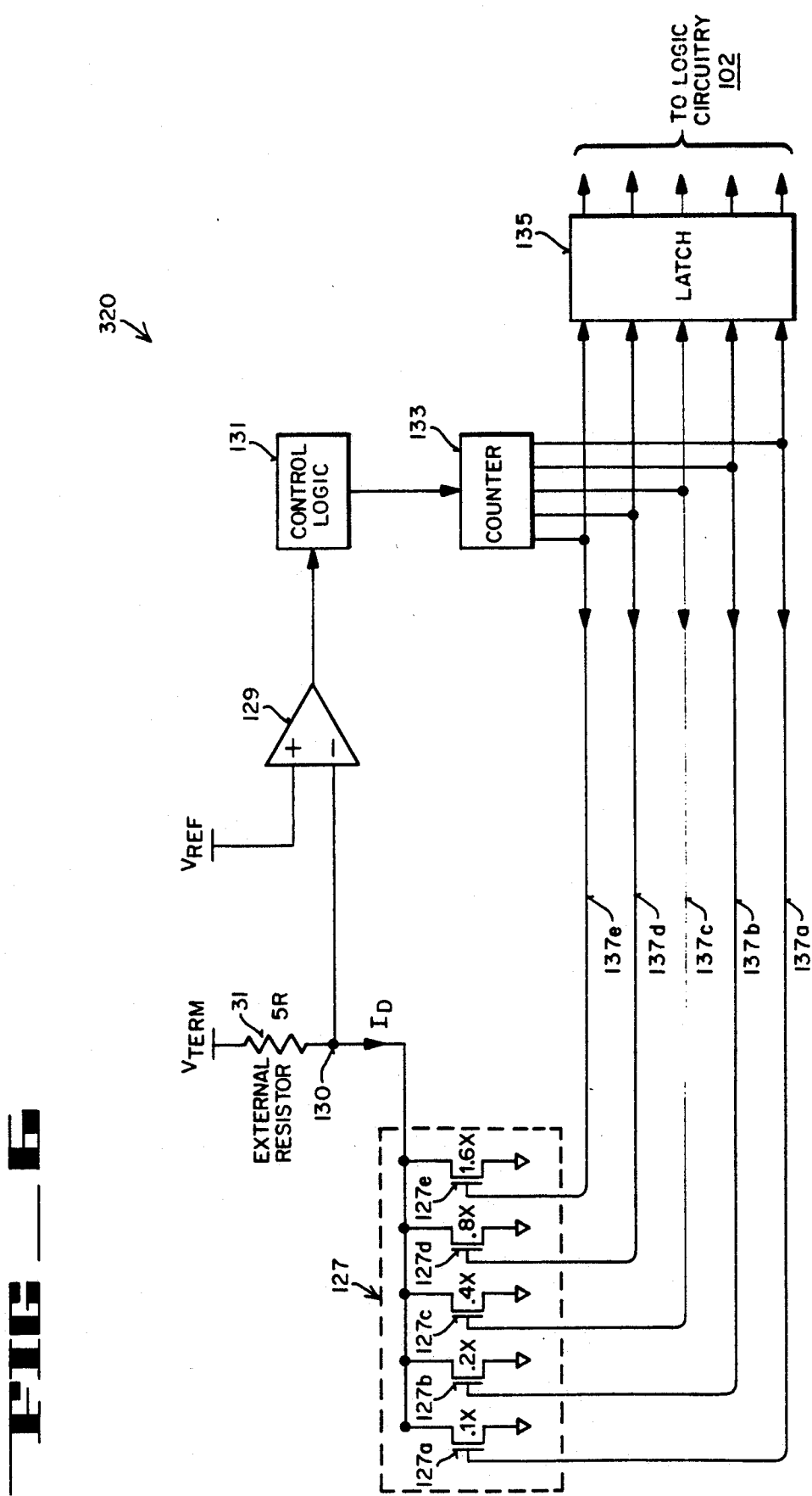
FIG. 6 is a circuit diagram of one embodiment of the current controller of FIG. 4.

FIG. 6 is a circuit diagram of current controller 320, which is one embodiment of current controller 120 of FIG. 4. Current controller 320 of FIG. 6 is a resistor reference current controller.

For one embodiment, current controller 320 is part of a driver 100 that resides within master 11. Current controller 320 is especially suited for use in master 11 rather than in slaves 12a–12n because current controller 320 is connected to an external resistor 31. For one embodiment, master 11 is a microprocessor and there is room on a circuit board for an external resistor to be placed next to master. For one embodiment, slaves 12a–12n reside close together, with less room for any external circuitry.

For an alternative embodiment, however, current controller 320 is part of a driver 100 that resides within one of slaves 12a–12n.

External resistor 31 is used to set the value of the desired current of transmission line 111. External resistor 31 is coupled to the $V_{term}$ termination voltage and a node 130. External resistor 31 is located outside of driver 100 and outside of master 11. For one embodiment, the resistance value of external resistor 31 is 5R. The user can, however, select or choose the particular value of resistor 31 that he or she desires.

For an alternative embodiment, external resistor 31 has a variable resistance that is user controllable.

Current controller 320 also includes a transistor array 127. Transistor array 127 is coupled to node 130. Transistor array 127 mimics transistor array 101 of FIG. 4. Transistor array 127 is on the same die as transistor array 101. Transistor array 127 and transistor array 101 reside within the same master or slave. The difference between transistor arrays 127 and 101 is that the width of each of transistors 127a–127e in transistor array 127 is one tenth of that of the corresponding one of transistors 101a–101e of transistor array 101. This 10:1 scaling is done to reduce power consumption inside current controller 320. In addition, this scaling factor also helps to minimize the size of transistor array 127. The resistance of transistor array 127 divided by the resistance of resistor 31 yields a quotient that is twice the quotient produced by dividing the resistance of transistor array 101 divided by the resistance of resistor 112 of FIG. 4. Thus, resistor 31 and transistor array 127 form a 2:1 scaling factor in comparison with resistor 112 and transistor array 101.

For alternative embodiments, the width of each of transistors 127a–127e can be larger or smaller than one tenth of that of the respective one of transistors 101a–101e.

Current controller 320 also includes comparator 129 coupled to node 130. Comparator 129 is also coupled to receive the reference voltage $V_{ref}$. The output of comparator 129 is coupled to output logic 131 that in turn is coupled to a counter 133. Output logic 131 controls the starting, stopping, and initializing of counter 133. The final count from counter 133 is fed to logic circuitry 102 of driver 100 (of FIG. 4) via a latch 135.

The output of counter 133 is coupled to the gates of transistors 127a-127e via lines 137a through 137e. The output of counter 133 is also applied to latch 135 via lines 137a-137e. Latch 135 then supplies the final count of counter 133 to respective NAND gates 102a-102e of logic circuitry 102 (of FIG. 4) via lines 103a-103e. The output of counter 133 also controls the on and off states of transistors 127a-127e via lines 137a-137e, respectively. The output of counter 133 is binary form. When counter 133 reaches a final count of "00101" (i.e., five in decimal), for example, transistors 127a and 127c are turned on and transistors 127b and 127d-127e are turned off.

When counter 133 is set to initially output all "0" states, transistors 127a-127e of transistor array 127 are thus all initially turned off. Node 130 is pulled up to the $V_{term}$ voltage. Control logic 131 then causes counter 133 to start counting. When counter 133 counts one in binary form, the output of counter 133 turns on transistor 127a. Resistor 31 has a voltage drop across caused by the current flowing through transistor 127a. The voltage at node 130 depends on the current $I_D$ flowing through transistor array 127. The voltage at node 130 is then compared with the $V_{ref}$ voltage at comparator 129 to determine if the voltage at node 130 has gone below the $V_{ref}$ voltage. If so, the output of comparator 129 flips and counter 133 stops counting. If not, counter 133 continues its counting. If counter 133 reaches a count of two in binary form, transistor 127b is turned on. The voltage across resistor 31 increases because the current flowing through transistor 127b is doubled which causes the voltage at node 130 to further drop. If counter 133 reaches a count of three, transistors 127a and 127b are both turned on. Counter 133 counts under the control of control logic 131 until the voltage of node 130 reaches the $V_{ref}$ voltage.

There are other means besides counter 133 that can determine and control a current. For example, logic circuitry performing successive approximations could be used to determine and set the desired current I.

For one embodiment, counter 133 counts at a speed that is equal to the speed of the clock for bus 30. In other words, counter 133 counts at the frequency provided by clock 35 of bus system 10.

Counter 133 stops counting when the voltage at node 130 starts to go below the $V_{ref}$ voltage level. The output of comparator 129 then flips, which causes control logic 131 to stop counting. Particular combination of transistors 127a-127e provide the current $I_D$ that can cause the voltage at node 130 to be slightly less than the $V_{ref}$ voltage. The final count of counter 133 causes the particular combination of transistors 127a-127e to conduct such that the current $I_D$ causes the voltage at node 130 to be approximately equal to $V_{ref}$. The final count is then latched by latch 135 and then coupled to logic circuitry 102 to turn on the same combination of transistors 101a-101e of transistor array 101. The desired current I can thus be accurately set for transmission line 111. Given that the desired current I flows through resistor 112, a desired low voltage $V_{OL}$ can also be accurately set for transmission line 111.

For example, when counter 133 stops counting at a count of "00111" (in binary form), transistors 127a-127c receive logical high signals via lines 137a-137c while transistors 127d-127e receive logical low signals via lines 137d-137e. Therefore, transistors 127a-127c are turned on and transistors 127d-127e are turned off. At this point the desired control current $I_D$ provided by transistors 127a-127c is such that the voltage at node 130 is approximately equal to $V_{ref}$.

Because of the 10:1 scaling of the widths of transistors 101a-101e (of FIG. 4) with respect to transistors 127a-127e and because of the 5:1 scaling of resistors 31 and 112, the count of counter 133 represents the value that can turn on the same combination of transistors 101a-101e to provide the desired current I on transmission line 111. The desired current I results in a $V_{OL}$ voltage on transmission line 111 given the current flow through termination resistor 112.

For an alternative embodiment, counter 133 is initialized to all "1" states. When counter 133 is set to initially output all "1" states, transistors 127a-127e of transistor array 127 are all initially turned on. Node 130 is pulled below the $V_{ref}$ voltage. Control logic 131 then causes counter 133 to start counting down, which turns off some of transistors 127a-127e according to the count of counter 133. Counter 133 continues to count until the voltage at node 130 reaches the $V_{ref}$ voltage, at which time comparator 129 issues a logical high signal to control logic 131. Control logic 131 then causes counter 133 to stop counting.

Because of the 2:1 scaling factor of the resistances of resistor 31 and transistor array 127 of FIG. 6 with respect to the resistances of resistor 112 and transistor array 101 of FIG. 4, the count of counter 133 is such that transistor array 101 causes a $2(V_{term} - V_{ref})$ voltage drop across resistor 112 to achieve a symmetric swing around $V_{ref}$.

It is to be appreciated that control logic 131 and counter 133 can be designed such that the output of latch 135 is close to or at the optimum counter value most of the time. For one embodiment, measurements are made at regular intervals—for example, one measurement per millisecond. This will usually be sufficient to track temperature changes.

Because transistor array 127 of current controller 320 and transistor array 101 (FIG. 4) reside on the same chip, their output currents track each other, which in turn causes the output current of transistor array 101 (i.e., the desired current I) to be substantially independent of processing variations, power supply variations and temperature variations.

Figure 7:
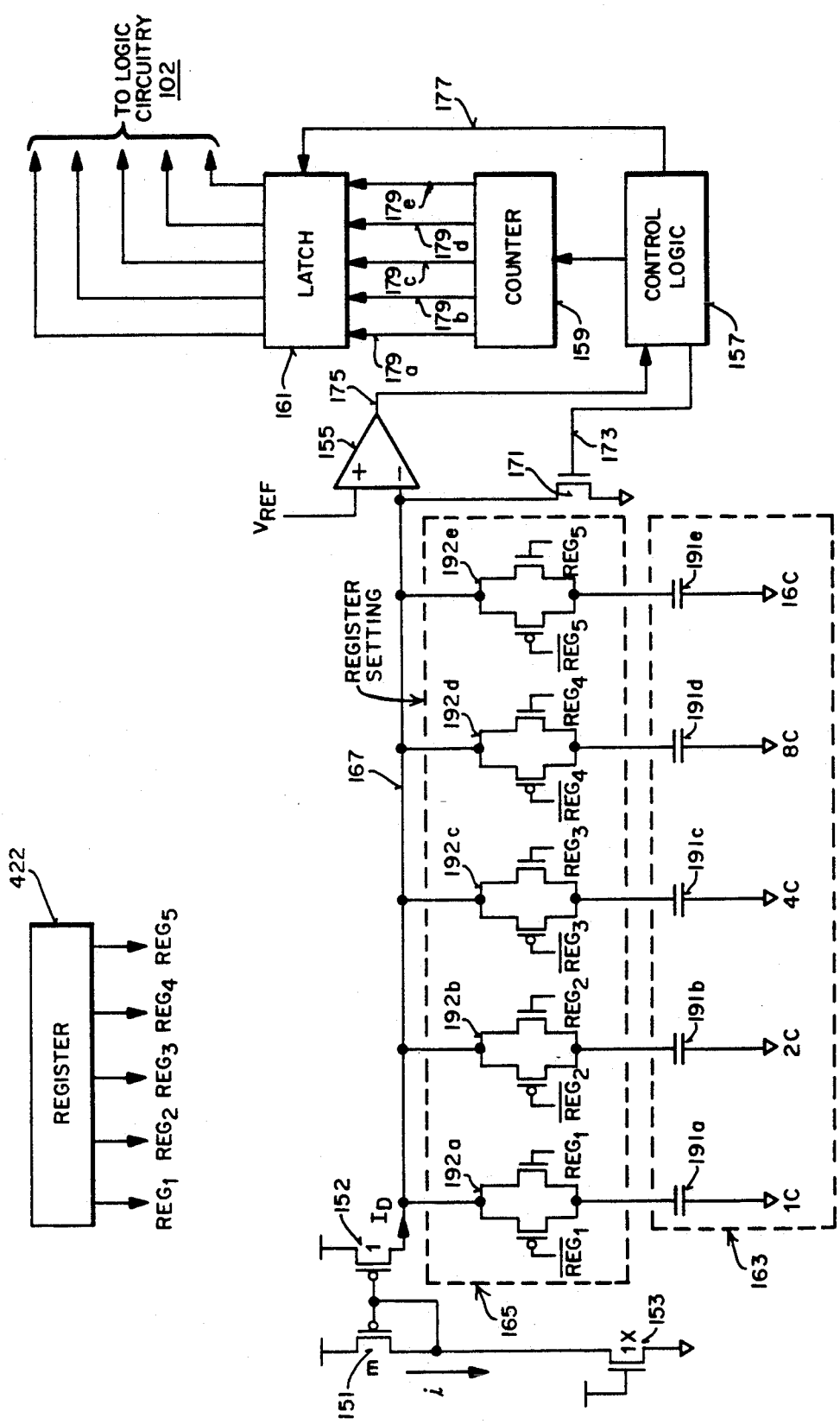
FIG. 7 is a circuit diagram of another embodiment of the current controller of FIG. 4.

FIG. 7 is a circuit diagram of capacitor reference controller 420. Capacitance reference controller 420 is another embodiment of current controller 120 of FIG. 4. For one embodiment, capacitor reference controller 420 is part of a current driver 100 that resides in one of the slaves 12a-12n. Capacitor reference current controller 420 is especially suited for each of the slaves 12a-12n because capacitor current controller 420 does not require an external off-chip resistor. Capacitor reference current controller 420 instead uses on-chip capacitors, which minimizes the use of pins and off chip components. This in turn allows the slaves to be arranged close to each other.

For an alternative embodiment, however, capacitor reference controller 420 is part of driver 100 that resides within master 11.

In FIG. 7, a capacitor array 163 is provided to allow a user to set the value of the desired current on transmission line 111 of FIG. 4. Capacitor reference current controller 420 relies on the measurement of the time that it takes to ramp capacitor array 163 from zero volts to $V_{ref}$ voltage. When the current ramping capacitor array 163 is proportional to the desired current on transmission line 111, then the time required to reach $V_{ref}$ will depend upon the desired current, temperature, and voltage.

In FIG. 7, controller 420 includes a current mirror circuit formed by P-channel transistors 151 and 152 and N-channel transistor 153. The current mirror circuit takes the pull down current provided by transistor 153 and produces a pull-up current that is portional to 1/m that of transistor 153. Transistor 151 has a width that is m times that of transistor 152. The current mirror circuit acts as the charging source for capacitor array 163. Transistor 153 mimics the pull-down capability of the minimum size of transistor 101a. Transistor 153 has a width that is equal to that of transistor 101a of transistor array 101. Transistor 153 is fabricated on the same chip (i.e., the same die) as transistor 101a. The output of the current mirror circuit is coupled to capacitor array 163 and to one input of comparator 155 via line 167. The function of the current mirror circuit is to reduce the current that charges capacitor array 163 so as to reduce the size of capacitors required for capacitor array 163. Therefore, m can be referred to as a scaling factor for reducing the size of capacitors that are required in capacitor array 163.

Capacitor array 163 includes five capacitors 191a through 191e. Each of capacitors 191a-191e is coupled to line 167 via one of transmission gates 192a through 192e. Transmission gates 192a-192e form a register setting circuit 165. Each of transmission gates 192a-192e receives one of REG$_1$ through REG$_5$ signals in complementary fashion. For example, transmission gate 192a receives a REG$_1$ signal and a $\overline{REG_1}$ signal. $\overline{REG_1}$ signal is an inverted version of the REG$_1$ signal. The REG signals are provided from a register 422 that receives a register setting value K from master 11 (of FIG. 1).

Each of transmission gates 192a-192e includes a P-channel transistor and an N-channel transistor, providing switchable paths to charge and discharge the respective capacitor of capacitors 163. The on and off states of each of transmission gates 192a-192e depend on the REG signal applied, which in turn depends on the register setting value K. Therefore, the capacitance connected to line 167 is controllable.

Controller 120 also includes a discharge transistor 171 coupled between line 167 and ground. The on and off states of discharge transistor 171 are controlled by a control logic 157.

Control logic 157 receives the output of comparator 155 and causes counter 159 to begin counting. Counter 159 outputs a five bit binary logic value to latch 161 via lines 179a-179e. Latch 161 then applies the latched value to logic circuitry 102 to turn on a particular combination of transistors 101a-101e of FIG. 4 in order to provide the desired current. Control logic 157 is also coupled to latch 161 via line 177 to control the latching of the output of counter 159.

During operation, control logic 157 causes counter 159 to start counting when control logic 157 turns off discharge transistor 171. Counter 159 stops counting when the output of comparator 155 flips from one state to another. The final count of counter 159 is then loaded into latch 161.

The capacitance of the smallest capacitor 191a in capacitor array 163 can be determined according to the following equation:

$$i \cdot n = \frac{K \cdot C \cdot V_{ref} \cdot m}{t_{cycle}} \quad (1)$$

The letter n represents the final count value of counter 159 after counter 159 receives the trigger signal from comparator 155. The letter m represents the scaling factor with respect to the current mirror (i.e., transistor 151 has a width that is m times that of transistor 152). $t_{cycle}$ represents the speed at which counter 159 counts which, in one embodiment, is the rate of the clock signal on line 16 (of FIG. 1). In one embodiment, $t_{cycle}$ is 4 nanoseconds per cycle. The letter i represents the current flowing through transistor 153. K represents the decimal equivalent of the binary register setting. As stated above, K is user controllable. The binary value of K controls transmission gates 192a-192e and determines which ones of capacitors 191a-191e are connected to line 167.

Current controller 420 keeps the left hand side of equation 1 substantially constant. i·n is the total current in transmission line 111. Because of current controller 420, the desired current I equals i·n. This means that if the current i flowing through transistor 153 decreases due to variations in temperature, processing, or the power supply, then n increases accordingly.

For one embodiment, the maximum current $I_{MAX}$ is 35 milliamps. Rather, $I_{MAX}$ is not the maximum absolute current. $I_{MAX}$ is the maximum current that is regulated. When K equals 31 (decimal), this means that all transmission gates 192a-192e are turned on, which in turn means that each of the capacitors 191a-191e is connected to line 167. Thus, when K equals 31, the total current i·n on transmission line 111 equals $I_{MAX}$, which is 35 milliamps. For a maximum current i·n of 35 milliamps, a 4 ns cycle time, a $V_{ref}$ of 2.2 volts, a scaling factor m of 20, and a K of 31, the following is true:

$$C = 0.1 pF \quad (2)$$

Given that the capacitances of capacitors 191a-191e are governed by the binary relationship 1C, 2C, 4C, 8C, and 16C, the total capacitance of capacitor array 163 equals:

$$\begin{aligned} C_{TOTAL} &= 1C + 2C + 4C + 8C + 16C \\ &= 31C \end{aligned} \quad (3)$$

Because the value of capacitance C is 0.1 pF, the following is true:

$$C_{TOTAL} = 31 \cdot 0.1 pF = 3.1 pF \quad (4)$$

For one embodiment of the present invention, this total capacitance of 3.1 pF is a reasonable total capacitance for on-chip capacitor array 163.

In some embodiments, the right hand side of equation 1 is well controlled in manufacture and use, so that the value of K may be calculated in advance by the user.

Because the capacitance of each of capacitors 191a-191e might vary during fabrication and might not be identical to the desired value, it is useful to calibrate the register setting K value in order to compensate for variations in capacitance C. This is done through a calibration process described below.

Figure 8:
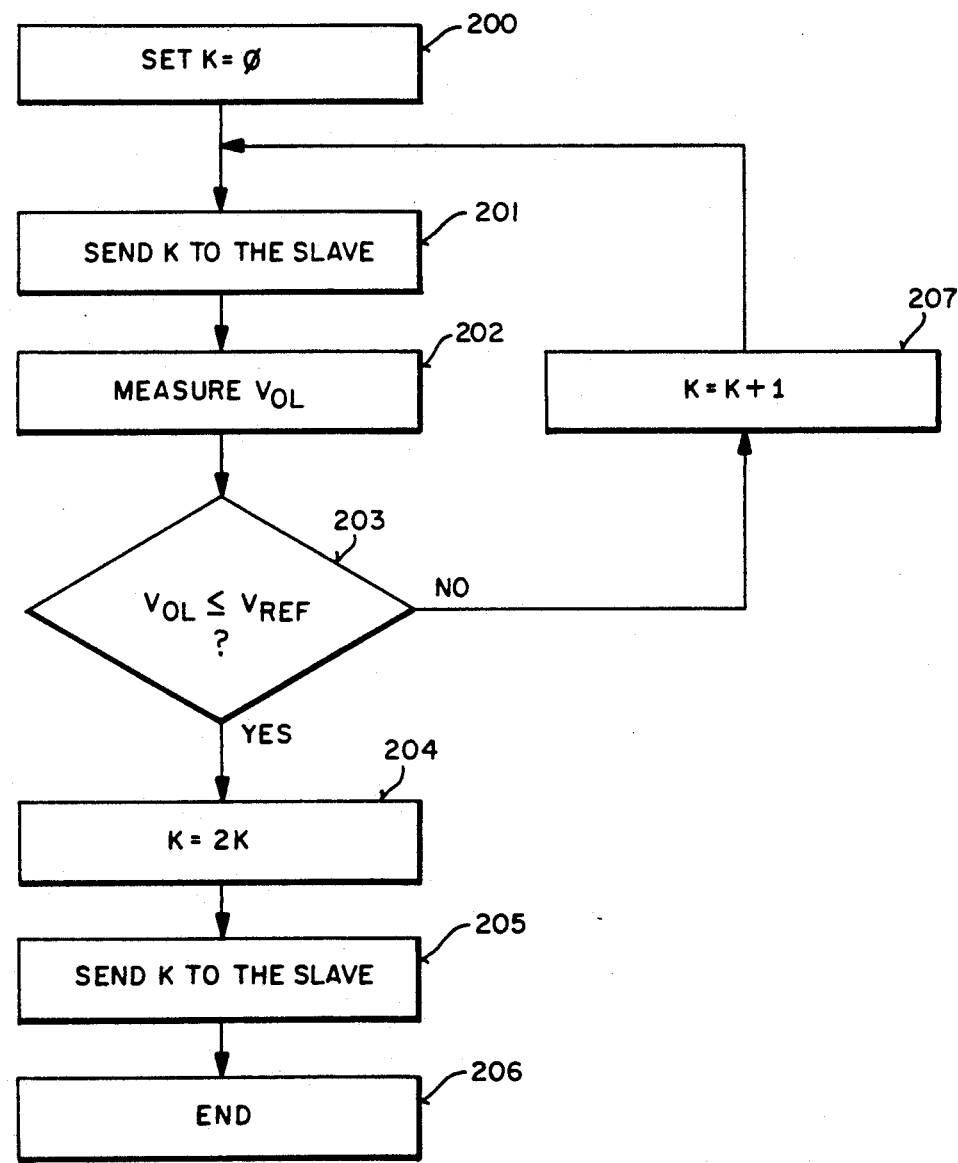
FIG. 8 is a flow chart that shows the process of calibrating the capacitance of the current controller of FIG. 7.

FIG. 8 illustrates the process of calibrating the register setting value K for current controller 420 of FIG. 7. The calibration is performed externally from master 11 (of FIG. 1).

Referring to FIG. 8, master 11 communicates with slaves 12a-12n by sending packets. Master 11 begins the calibration process at step 200 by setting the initial K value to zero. At step 201, master 11 sends the K value in a packet to a slave that needs a calibrated K value. The slave supplies the K value to driver 100 and current controller 420 to set the K value and induce a current and a low voltage $V_{OL}$ on the particular transmission line 111 of bus 30. The slave then sends another packet back to master 11. Master 11 measures the low voltage $V_{OL}$ of the packet at step 202. Master 11 does so using input samplers. At step 203, master 11 compares the sampled $V_{OL}$ with the $V_{ref}$ voltage and determines if $V_{OL}$ is less than or equal to $V_{ref}$. If not, the K value is increased by one at step 207 and the process returns to step 201, wherein master 11 sends the updated K value to the slave. If $V_{OL}$ is less than or equal to the $V_{ref}$ voltage, then the K value is doubled at step 204. The doubled K value provides a symmetric voltage swing around $V_{ref}$. At step 205, the calibrated K is sent from master 11 to the slave and the process ends at step 206.

For one embodiment, K is incremented in a linear manner as part of the calibration process. For an alternative embodiment, a binary search with respect to K is done as part of the calibration process.

For an alternative embodiment, the initial K value can be set at step 200 to a value that causes the initial $V_{OL}$ voltage to be below $V_{ref}$. For this alternative embodiment, master 11 compares the sampled $V_{OL}$ at step 203 with the $V_{ref}$ voltage to determine if $V_{OL}$ is greater than or equal to $V_{ref}$. If $V_{OL}$ is not greater than or equal to $V_{ref}$, then the K value is decreased at step 207 and the process repeats from step 201.

Figure 9:
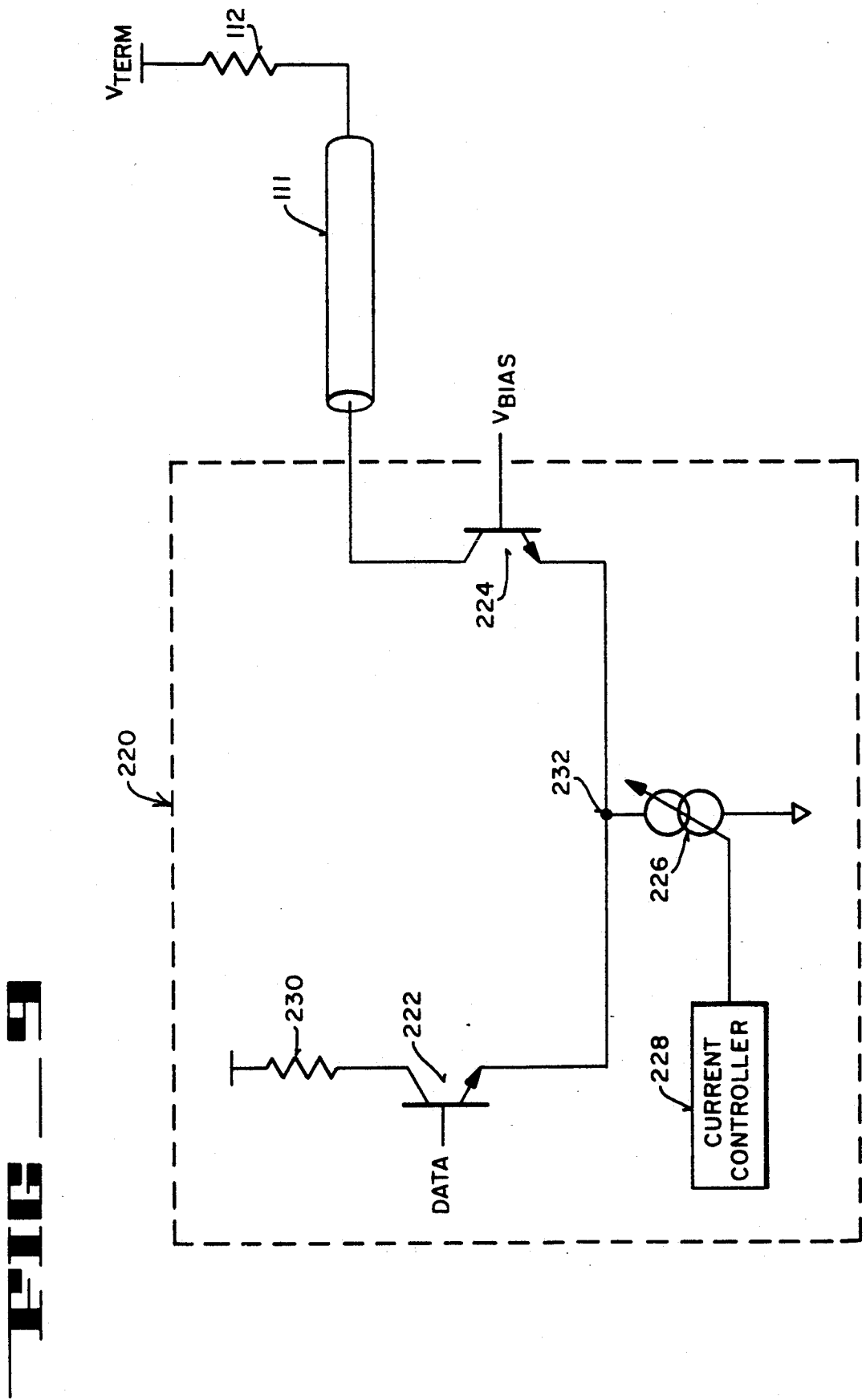
FIG. 9 is a circuit diagram of another current mode driver.

FIG. 9 is a circuit diagram of current mode driver 220. Current mode driver 220 is an alternative embodiment of the present invention. Current mode driver 220 includes a bipolar transistor 222 coupled to a power supply via resistor 230. Transistor 222 receives the data that the host master or slave wishes to output to line 111 of bus 30. Transistor 222 is coupled to a variable current source 226 via a node 232.

Bipolar transistor 224 is coupled between transmission line 111 and node 232. Transistor 224 is biased by a $V_{BIAS}$ voltage. For one embodiment, transistors 222 and 224 are both bipolar junction transistors.

Current source 226 is also coupled to current controller 228. The current of current source 226 can be adjusted by current controller 228.

Current controller 228 and variable current source 226 serve functions similar to those provided by current controller 120 output and logic circuitry 102 of FIG. 4.

During operation, when the data is a logical low signal that turns off transistor 222, current can flow through resistor 112, transmission line 111, transistor 224, and current source 226. Transistor 224 sinks a desired current from line 111. Given the voltage drop across resistor 112, a low voltage signal appears on line 111.

When the data applied to transistor 222 is a logical high signal, transistor 222 is turned on. Resistor 230 is a relatively small resistance. Therefore, when transistor 222 is turned on, the emitter of transistor 224 sees a voltage that is greater than the termination voltage. Therefore, transistor 224 does not conduct current. Therefore, current does not flow through line 111. Accordingly, a high voltage equal to the termination voltage appears on line 111.

FIG. 10 is a circuit diagram of current mode driver 250. Current mode driver 250 is another alternative embodiment of the present invention. Current mode driver 250 includes a variable current source 252 coupled to a bipolar junction transistor 258 via a node 262. The gate of transistor 258 receives data that the host master or slave wishes to output to bus line 111 transmission line 111. A bipolar junction transistor 254 is coupled between node 262 and a transmission line 111.

Current source 252 is also coupled to a current controller 260. Current controller 260 can adjust the amount of current flowing through current source 252.

Current controller 260 and variable current source 252 serve functions similar to those provided by current controller 120 and output logic means 102 of FIG. 4.

During operation, when the data applied to the gate of transistor 258 is logically high, transistor 258 is turned on. This causes the gate of transistor 254 to be shorted to ground, which turns transistor 254 off. When transistor 254 is off, no current flows through transmission line 111. Therefore, the termination voltage appears on line 111.

Current controller 260 adjusts the current flowing through current source 252 which compensates for Beta variations of transistor 254—i.e., changes in the gain of transistor 254 caused by temperature variations.

On the other hand, when the data applied to the gate of transistor 258 is logically low, transistor 258 is turned off. When this happens, current source 252 causes a portion of the supply voltage to appear on the gate of transistor 254. This turns on transistor 254. When transistor 254 is turned on, current flows through resistor 112, transmission line 111, transistor 254, and resistor 256. A voltage drop appears across resistor 112, and a low voltage appears on transmission line 111.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. Electrical current source circuitry for a bus, comprising:
   (A) transistor means coupled between the bus and ground for controlling bus current;
   (B) control circuitry coupled to the transistor means;
   (C) a controller coupled to the control circuitry for controlling the transistor means, wherein the controller comprises:
   (1) a variable level circuit comprising
      (a) setting means for setting a desired current for the bus; and
      (b) transistor reference means coupled to the setting means, wherein the variable level circuit provides a first voltage;
   (2) voltage reference means for providing a reference voltage;
   (3) comparison means coupled to the voltage reference means and the variable level circuit for comparing the first voltage with the reference voltage;

(4) logic means responsive to a trigger signal from the comparison means, wherein an output of the logic means is coupled to the control circuitry in order to turn on the transistor means in a manner dependent upon the output of the logic means.

2. The electrical current source circuitry of claim 1, wherein
(A) the transistor means comprises a plurality of transistors;
(B) the control circuitry comprises logic circuitry coupled to the gates of the plurality of transistors.

3. The electrical current source circuitry of claim 1, wherein the transistor means comprises a transistor.

4. The electrical current source circuitry of claim 2, wherein the logic means comprises a counter for counting until receiving a trigger signal from the comparison means, wherein the output of the counter is coupled to the logic circuitry in order to turn on a particular combination of the plurality of transistors in a manner dependent upon a count of the counter.

5. The electrical current source circuitry of claim 4, wherein the counter is set to a final count upon receiving the trigger signal from the comparison means, wherein the final count is latched, and wherein the output of the counter coupled to the logic circuitry is the latched final count of the counter.

6. The electrical current source circuitry of claim 2, wherein the setting means is an external resistor.

7. The electrical current source circuitry of claim 2, wherein respective widths of the plurality of transistors coupled between the bus and ground are binary multiples of one another.

8. The electrical current source circuitry of claim 1, wherein the transistor reference means comprises a plurality of transistors.

9. The electrical current source circuitry of claim 8, wherein respective widths of the plurality of transistors of the transistor reference means are substantially smaller than the respective widths of the plurality of transistors coupled between the bus and ground.

10. The electrical current source circuitry of claim 1, wherein the setting means comprises a plurality of capacitors.

11. The electrical current source circuitry of claim 10, wherein the transistor reference means is a current mirror circuit.

12. The electrical current source circuitry of claim 10, wherein respective capacitances of the plurality of capacitors are binary multiples of one another.

13. The electrical current source circuitry of claim 10, wherein the plurality of capacitors are coupled to the transistor reference means in a user-settable manner.

14. The electrical current source circuitry of claim 1, wherein the settable desired current is substantially independent of a power supply variation, a process variation, and a temperature variation.

15. An output driver for an electronic device coupled to a bus, wherein the bus is coupled to a voltage supply via a termination resistor, wherein the output driver comprises:
(A) a plurality of transistors coupled between the bus and ground for controlling bus current;
(B) control circuitry coupled to gates of the plurality of transistors;

(C) a controller coupled to the control circuitry for controlling the plurality of transistors, wherein the controller comprises:
(1) resistor means coupled to the voltage supply for setting a desired current;
(2) transistor reference means comprising a plurality of transistors coupled between the resistor means and ground, wherein the plurality of transistors of the transistor reference means are selectively turned on to provide a variable voltage;
(3) comparison means coupled to receive the variable voltage for comparing the variable voltage with a reference voltage;
(4) a counter; and
(5) control logic coupled to (i) the comparison means and (ii) the counter for causing the counter to count until a particular combination of the plurality of transistors of the transistor reference means is turned on by an output of the counter such that the variable voltage is approximately equal to the reference voltage, wherein the output of the counter is also coupled to the control circuitry in order to turn on a particular combination of the plurality of transistors coupled between the bus and ground.

16. The output driver of claim 15, wherein the control circuitry comprises logic circuitry.

17. The output driver for an electronic device of claim 15, wherein the plurality of transistors coupled between the bus and ground comprise five N-channel metal-oxide semiconductor (NMOS) transistors, wherein respective widths of the five NMOS transistor are binary multiples of one another.

18. The output driver of claim 17, wherein the plurality of transistors of the transistor reference means comprise five NMOS transistors, wherein respective widths of the five NMOS transistors of the transistor reference means are substantially smaller than the widths of the respective five NMOS transistors of the plurality of transistors coupled between the bus and ground.

19. The output driver of claim 15, wherein the resistor means comprises a resistor with a resistance five times a resistance of the termination resistor.

20. The output driver of claim 15, wherein the electronic device is a microprocessor.

21. The output driver of claim 15, wherein the electronic device is a dynamic random access memory (DRAM).

22. The output driver of claim 15, wherein the voltage supply is approximately 2.5 volts and the reference voltage is approximately 2.2 volts.

23. The output driver of claim 15, wherein the control circuitry comprises a plurality of logic gates, wherein each logic gate is coupled to a gate of a respective one of the plurality of transistors.

24. The output driver of claim 15, further comprising a latch coupled to the counter for latching the count of the counter and for supplying the count to the control circuitry.

25. The output driver of claim 15, wherein the settable desired current is substantially independent of a power supply variation, a process variation, and temperature variation.

26. An output driver for an electronic device coupled to a bus, wherein the bus is coupled to a voltage supply via a termination resistor, wherein the output driver comprises:

(A) a plurality of transistors coupled between the bus and ground for controlling bus current;

(B) control circuitry coupled to gates of the plurality of transistors;

(C) a controller coupled to the control circuitry for controlling the plurality of transistors, wherein the controller comprises:

(1) current mirror means coupled to a voltage supply and ground, wherein the current mirror means has an output supplying a current with a predetermined value proportional to a desired current;

(2) capacitor means having a plurality of capacitors selectively coupled to the output of the current mirror means, wherein the capacitor means receives the current from the current mirror means, wherein the capacitor means provides a variable voltage when charged by the current;

(3) comparison means coupled to receive the variable voltage for comparing the variable voltage with a reference voltage;

(4) a counter; and (5) control logic coupled to (i) the counter, (ii) the comparison means, and (iii) the output of the current mirror means for causing the capacitor means to be charged to the variable voltage and for causing the counter to start counting when the capacitor means is charged, wherein the control logic causes the counter to count until receiving a trigger signal from the comparison means that indicates that the variable voltage is approximately equal to the reference voltage, wherein an output of the counter is coupled to the control circuitry in order to turn on a particular combination of the plurality of transistors in a manner dependent upon a count of the counter.

27. The output driver of claim 26, wherein the control circuitry comprises logic circuitry.

28. The output driver of claim 26, wherein the electronic device is a DRAM.

29. The output driver of claim 26, wherein the electronic device is a microprocessor.

30. The output driver of claim 26, wherein the plurality of transistors comprise five NMOS transistors, wherein respective widths of the five NMOS transistors are binary multiples of one another.

31. The output driver of claim 26, wherein the current mirror means comprises a first P-channel transistor, a second P-channel transistor, and a first N-channel transistor, wherein a width of the first N-channel transistor is equal to that of one of the plurality of transistors, wherein a width of the first P-channel transistor is approximately twenty times of that of the second P-channel transistor.

32. The output driver of claim 26, wherein the plurality of the capacitors have capacitances that are binary multiples of one another.

33. The output driver of claim 26, wherein the plurality of capacitors are coupled to the output of the current mirror means in a user-settable manner.

34. The output driver of claim 26, wherein the reference voltage is approximately 2.2 volts and the voltage supply is equal to approximately 2.5 volts.

35. The output driver of claim 27, wherein the logic circuitry comprises a plurality of logic gates, wherein each logic gate coupled to a gate of a respective one of the plurality of transistors.

36. The output driver of claim 26, wherein the settable desired current is substantially independent of a power supply variation, a process variation, and a temperature variation.

37. The output driver of claim 26, further comprising a latch coupled to the counter for latching the count of the counter and for supplying the count to the control circuitry.

38. The output driver of claim 26, wherein the electronic device is a slave, wherein a master is coupled to the bus, and wherein the master causes selective ones of the plurality of capacitors to be coupled to the output of the current mirror means.

39. In a bus system comprising a bus, a master, and a slave with an output driver, a method for setting a current of the output driver for the bus of the slave comprising the steps of:

(A) setting a register setting to a first value;

(B) having the master send the register setting to the output driver of the slave;

(C) having the slave couple selective ones of a plurality of capacitors to an output of a current mirror means of the output driver based upon the register setting received from the master;

(D) causing the plurality of capacitors that are coupled to the output of the current means to charge to a variable voltage while a counter counts;

(E) comparing the variable voltage to a reference voltage;

(F) when the variable voltage approximately equals the variable voltage, then stopping the counter from counting and latching a final count of the counter;

(G) turning on a particular combination of a plurality of transistors coupled between the bus and ground based upon the final count of the counter in order to generate a first voltage level on the bus;

(H) sensing within the master the first voltage on the bus;

(I) comparing within the master the first voltage with the reference voltage;

(J) if the register setting does not approximately equal the reference voltage, then changing the register setting and repeating steps B through J;

(K) if the register setting does approximately equal the reference voltage, then:

(1) setting the register setting to a value that is double a present value of the register setting;

(2) having the master send the register setting to the output driver of the slave;

(3) having the slave couple selective ones of the plurality of capacitors to the output of the current mirror means of the output driver based upon the register setting received from the master.

* * * * *